INTERMODULATION SUPPRESSION SYSTEM

Filed Dec. 29, 1953

Inventors:
Arthur G. Manke,
Henry A. Bazydlo,
by Julius J. Zaskalicky
Their Attorney.

2,944,222
Patented July 5, 1960

2,944,222

INTERMODULATION SUPPRESSION SYSTEM

Arthur G. Manke, Syracuse, N.Y., and Henry A. Bazydlo, Detroit, Mich., assignors to General Electric Company, a corporation of New York Filed Dec. 29, 1953, Ser. No. 401,021
8 Claims. (Cl. 330—128)

This invention relates to amplifiers for electric waves and has as an object thereof to provide improvements in amplifiers of the kind used in radio receivers.

Amplifiers usually employed for the amplification of electric waves amplify these waves linearly over a very limited range of amplitudes. When a signal including waves exceeding the aforementioned range of amplitudes is applied to the electron discharge device of such an amplifier, a distorted or multiple frequency output is obtained. This is due to the natural curvature of the plate current characteristic of the discharge device. The effect of the curvature is to produce in the plate circuit frequencies of two and three times the input frequency. If a plurality of signals are applied to the amplifier discharge device, then a second harmonic of the stronger signal will appear in substantial amplitude in the plate circuit. The application of a second signal to the discharge device may then heterodyne this second harmonic to produce a difference frequency or intermodulation product. Calculation shows that the intermodulation product so formed will lie on a new frequency, not previously occupied by either of the applied signals, and spaced at twice the frequency difference between these signals. Should the intermodulation product fall on the same frequency or closely adjacent to the frequency of a desired signal, it will seriously interfere with the reception of the desired signal, usually either distorting the desired signal or preventing its detection altogether.

Intermodulation distortion is particularly serious in the preliminary radio frequency stages of a radio receiver. The radio spectrum is frequently crowded with a large number of signals closely spaced, and spaced at regular frequency intervals. Since the first tuned circuits are not sufficiently selective to eliminate many of the more closely spaced of the nearby signals from the preliminary amplifier discharge device, these signals are available to create new intermodulation products and consequent distortion of the desired signals. As the signals progress through the remaining portions of the receiver, however, the selectivity of the preceding tuned circuit augments the selectivity of the receiver at that point, so that in each successive stage the extraneous signals assume a smaller relative amplitude and the problem of intermodulation distortion is correspondingly reduced. It should be emphasized, however, that no increase in selectivity in the subsequent stages will be effective to eliminate the distortion caused in the desired signal in the preliminary amplifier. The distortion may only be cured by the use of a preliminary amplifier which does not produce such distortion.

Accordingly, it is an object of the present invention to provide an amplifier for electric waves in which intermodulation distortion of a desired signal is substantially reduced.

Another object of the present invention is to provide an amplifier for electric waves such as may be employed as a preliminary radio frequency amplifier of a radio receiver, in which intermodulation distortion of a desired signal exceeding a predetermined amplitude is substantially reduced.

In carrying the present invention into effect as applied to a radio receiver, there is provided a plurality of amplifier stages connected in cascade and tuned to pass a band of frequencies. Means are also provided for coupling waves appearing at the input of one of the stages directly to the output thereof. Means are further provided responsive to waves appearing in the output of a succeeding one of the stages and having an amplitude greater than a predetermined amplitude for maintaining the amplifying device of the one stage inoperative. Thus, undesired frequencies are subject to the selectivity of the one stage and thus substantially attenuated before application to a further stage of amplification, thereby substantially eliminating the aforementioned intermodulation effects.

As an embodiment in accordance with the invention, there is provided a selective amplifier for minimizing the effect on linearity and selectivity of amplification of a desired band of frequencies by undesired large amplitude waves having frequencies adjacent to the aforesaid band of frequencies. The selective amplifier comprises first and second amplifier stages connected in cascade, each having an electron discharge device, an input and an output circuit connected thereto, the input circuit of the second stage being coupled to the output of the first stage, the circuits being tuned to pass the desired band of frequencies applied to the input of the first amplifier stage. There are provided means for coupling waves appearing at the input of the first amplifier stage directly to the output thereof and means responsive to waves appearing in the output circuit of the second stage and having an amplitude greater than a predetermined amplitude for rendering the electron discharge device of the first stage inoperative. Thus, waves having the undesired frequencies are selectively reduced in amplitude by the tuned circuits before reaching the input of the second stage and the desired band of frequencies are substantially unaffected, thereby minimizing the effect of the undesired frequencies on the amplification of the desired frequencies.

The novel features which are believed to be characteristic of this invention are set forth with particularity in the appended claims. The invention itself, however, both as to its organization and method of operation, together with further objects and advantages thereof may best be understood by reference to the following description taken in connection with the accompanying drawings in which:

Figure 1:
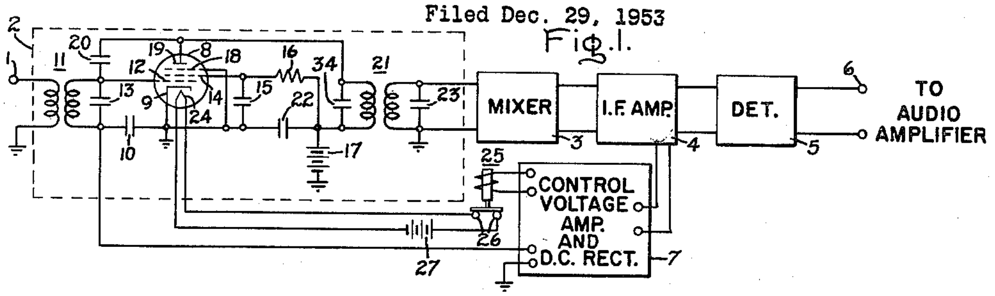
Fig. 1 is a diagrammatic representation of an embodiment of the invention.

Referring now to Fig. 1, there is shown a portion of a radio receiver comprising a preliminary radio frequency amplifier 2, a mixer 3, an intermediate frequency amplifier 4, a detector 5, and a control voltage amplifier and direct current rectifier 7. Received signals are applied at the input terminals 1, amplified by amplifier 2, converted to the intermediate frequency at the mixer 3, and further amplified by the intermediate frequency amplifier 4, and then detected at detector 5. The detected output may then be supplied to the output terminals 6 and further amplified in an audio amplifier not shown. The intermediate frequency amplifier is connected to the control amplifier and direct current rectifier 7, which controls the operation of the preliminary amplifier in a manner to be described.

The preliminary amplifier 2 comprises an electron discharge device 8 having a cathode 9, a control grid 12, a screen grid 14, a suppressor grid 18, and an anode 19, an input transformer 11, and an output transformer 21. The control grid 12, is coupled to one terminal of the input transformer secondary, the other terminal of the secondary of which is coupled to an output terminal of the device 7 and through a coupling capacitor 10 to the cathode 9. The cathode 9 is preferably grounded. The primary of the input transformer 11 is connected to the input terminals 1, and ultimately to an antenna or other source of signals not shown. A tuning capacitor 13 is connected in shunt with the secondary winding. The screen grid 14 is bypassed for radio frequencies to ground by a capacitor 15 and is connected through an isolating resistance 16 to the positive terminal of a source 17 of unidirectional operating potential whose negative terminal may be connected to ground. The suppressor grid 18 is connected to the cathode 9. The anode 19 is connected through a capacitor 20 to the grid 12 and through the primary winding of the output transformer 21 to the source 17. A capacitor 22 shunts the source 17. The primary and secondary windings of the output transformer 21 are provided with shunted tuning capacitors 34 and 23 respectively. A filamentary heater 24 for discharge device 8, is provided, connected in series with the contacts 26 of a normally closed relay 25, to a low potential source 27. Although, for convenience, potential source 27 is shown as a direct current source, it is apparent that a low potential alternating current source may also be employed. The actuating coil of the relay 25 is connected to the output of the device 7.

The preliminary amplifier provides selectivity to the receiver and amplification when the desired signal is of low or medium amplitude. Radio frequency signals applied to the terminals of the input radio frequency transformer 11 are transformed in the secondary, and supplied to the input of discharge device 8. The secondary of the transformer is tuned to resonate at the desired frequency with the capacitor 13. Hence signals at the desired frequency are applied to the input of the electron discharge device 8 in somewhat greater relative amplitudes than signals remote from the desired frequency. The signals are then amplified in the discharge device 8 and applied across the primary of the output transformer 21. The secondary of the output transformer 21 then receives the amplified signals and by virtue of the additional tuned circuits in the primary and secondary of the output transformer, the signals at the desired frequency appear at the output terminals of the amplifier 2 in greatly increased amplitude, while those remote from the desired frequency are amplified to a lesser degree and appear at correspondingly smaller amplitudes. So long as the amplitudes of the applied signals are in the linear operating regions of the electron discharge device 8, the amplified version of the signals appearing at the output terminals of the amplifier 2 will be substantially undistorted.

When signals of relatively high amplitudes are applied to the input terminals of the amplifier 2, the electron discharge device 8 would ordinarily be caused to operate nonlinearly and intermodulation effects would arise. In order to eliminate these effects, means are provided for cutting off the discharge device 8 when the desired signal is of an adequately high amplitude for detection without the use of the amplification available at the discharge device 8. Included in these means is the control voltage amplifier and direct current rectifier 7, which comprises a further intermediate frequency amplifier, a direct current rectifier having a delaying circuit, and optionally a further direct current amplifier. A portion of the signals appearing in the intermediate frequency amplifier, are then applied to the input of 7, where they are amplified to a high level, and then applied to the delayed direct current rectifier. The delay of the direct current rectifier is adjusted to a value such that signals below the desired amplitude produce no direct current potential. When this amplitude is exceeded, a rectified direct current potential appears in the rectifier output, which is applied to reduce the amplification of the discharge device 8 in a conventional manner. The output voltage of 7 is also applied to the generating winding of the relay 25. If the applied signal reaches a still higher level, the relay 25, which is set to respond at a higher voltage appearing in the output of 7, operates causing complete deenergization of the discharge device 8. In order to prevent fluttering, the relay 25 may be provided with a substantial time delay. Since the discharge device 8 is now completely non-conductive, an auxiliary signal path, independent of the discharge path of the discharge device is provided to permit passage of the signals through the preliminary amplifier 2. In Fig. 1, the capacitor 20 provides this path. It is seen that by means of capacitor 20, the waves appearing at the input of discharge device 8 are applied to the output of device 8, i.e., to the primary winding of transformer 21, the waves being coupled from input to output in shunt of electron discharge device 8.

The adjustment of the voltage at which the relay 25 operates, and the choice of the kind and amount of feed-through depend in great measure upon the way in which the amplifier is used. In general, it is desirable to cut off the discharge device 8 as soon as the desired signal has sufficient amplitude without further amplification. When the discharge device 8 is thus cut off, adjacent signals cannot cause intermodulation in the amplifier 2 even when they are of much greater amplitude than the desired signal, since the discharge device of the amplifier 2 alone introduces distortion.

The capacitor type of feed-through illustrated in Fig. 1 is preferred principally because it offers a convenient means of controlling the amount of feed-through. The selectivity of the input circuit and consequently, that of the preliminary amplifier improves appreciably when the discharge device is disabled by heater disconnection since under this condition the input grid loading essentially disappears. Other means of disabling may be employed such as by the use of sufficient control voltage applied to the control grid or screen grid, to completely disable the discharge device.

Feed-through capacitive coupling may be obtained in other ways, in addition to providing a separate capacitor. Frequently, choice of a discharge device having a high grid-plate capacitance, will provide adequate coupling. In certain of the discharge devices used in high frequency applications, the terminals are so closely spaced, that appreciable capacity may exist between the terminals of their sockets. To reduce coupling between the signal grid and anode in such arrangements, a grounded central shield is generally provided. If this shield is left ungrounded, adequate additional grid-plate coupling capacity may be obtained, since the magnitude of the capacity required may be only one micro-microfarad at frequencies on the order of 100 megacycles. Relatively little feed-through capacity is required because the capacity is effectively coupled between the secondary of the input transformer and the primary of the output transformer, both of which may be of high impedance.

Figure 2:
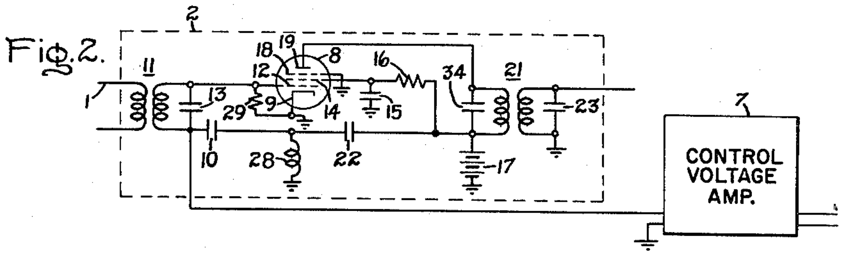
Fig. 2 is a simplified schematic representation of a second embodiment of the invention.

Referring now to Fig. 2, there is shown another embodiment of the present invention. Elements in Fig. 2, similar to those shown in Fig. 1, bear the same reference numerals. In this figure the control amplifier 7 is used to control only the signal grid voltage of the electron discharge device 8. The output voltage of the control voltage amplifier 7 consequently must be high enough to render the discharge device non-conducting.

The feed-through path for the signals is provided by means of the common ground return impedance 28 for the bypass capacitors 10 and 22 of both the input and output circuits of the input stage 2. The cathode 9 is grounded directly and the control grid 12 is provided with a suitable ground return resistance 29. The common ground impedance 28 then provides a path between the input transformer and the output transformer around the electric discharge device 8.

In operation, the embodiment of Fig. 2 is similar to that of Fig. 1. The presence of signal levels exceeding a predetermined value causes a voltage to appear in the output of the device 7, this voltage rapidly increasing with increasing signal levels to a point where at a desired intensity complete cut-off of the discharge device 8 is obtained. At the same time the common input and output impedance 28 provides coupling between the input and output of the amplifier 2. The coupling impedance 28, in high frequency applications, may be conveniently obtained by using a common ground return lead for the input and output bypass condensers 10 and 22.

Figures 3, 4:
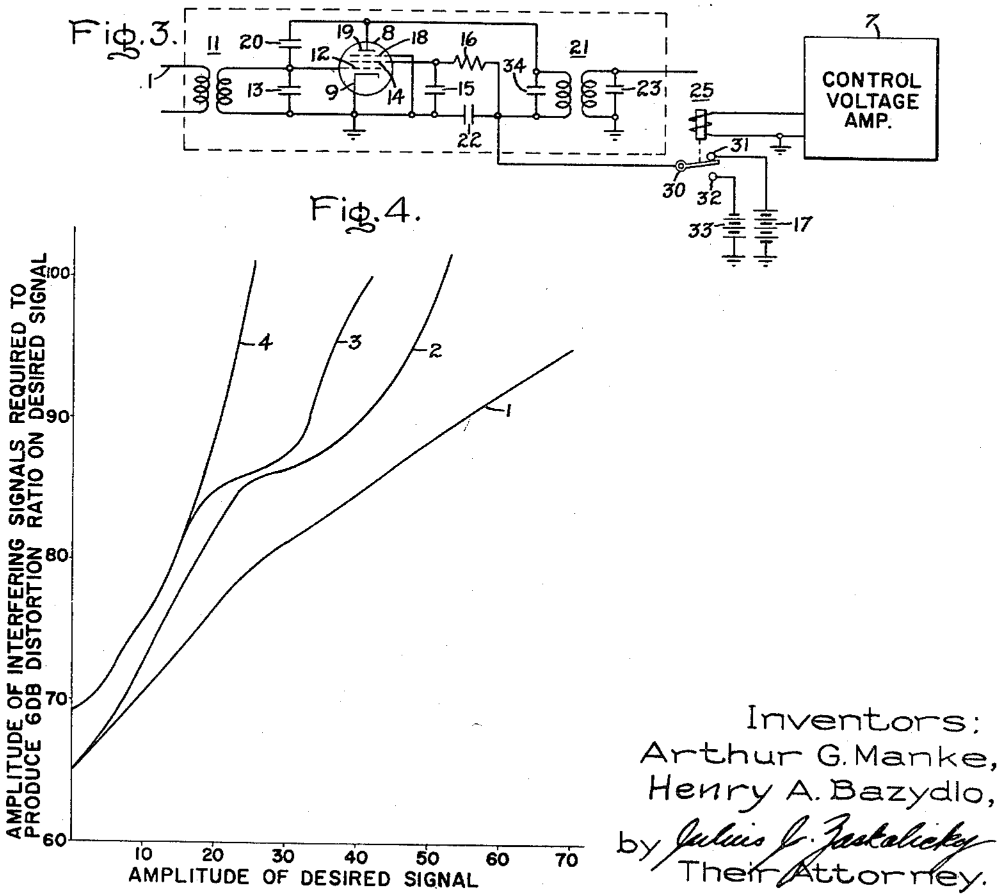
Fig. 3 is a simplified schematic representation of a second embodiment of Fig. 1.
Fig. 4 is a diagram illustrating the intermodulation characteristics of different embodiments of the present invention.

Fig. 3 illustrates another embodiment of the invention. In this figure, a relay 25 is employed to selectively disable the discharge device 8 by changing the potential applied to screen 14 of the discharge device. The operating winding of the relay 25 is connected to the output of the control voltage amplifier 7. The relay 25 is provided with single-pole double-throw contacts, the common contact 30 being connected to the screen 14 of the discharge device and the other contacts 31 and 32 being connected respectfully to a source 33 of negative potential and the source 17 of positive potential. The voltages of the two sources are so chosen that when the screen 14 is connected to the source 33, the discharge device is substantially cut-off, and when the discharge device is coupled to the source 17, the discharge device is operative. Although, not shown, the signal grid bias may also be simultaneously controlled to reduce the gain of the amplifier in the conventional manner. Feed-through is obtained in this embodiment by means of a capacitor 20 between the grid and the plate 19 of the discharge device.

The invention has particular utility in radio receivers by virtue of the fact that the radio receiver is provided with a succession of tuned amplifiers, each adapted to handle a signal at a higher level. When high level signals are applied to the receiver, the first radio frequency amplifier may be disabled and the signal applied by feed-through to the second radio frequency amplifier stage or to the mixer stage. Since the following amplifier is designed to operate at a higher signal level, and may benefit from the cumulative selectivity of the tuned circuits of the preceding stages, intermodulation distortion is effectively eliminated.

Fig. 4 is a diagram illustrating the improved intermodulation characteristics of a frequency modulation receiver obtainable when the preliminary radio frequency amplifier is modified in accordance with the teachings of the present invention. The curves illustrate in particular the reduction to be achieved in three signal intermodulation interference, the interference produced when two interfering signals give rise to a spurious signal lying on the same frequency as the desired signal. The abscissa or "x coordinate" represents the amplitude in decibels of the desired signal above an arbitrary reference amplitude while the ordinate or "Y coordinate" represents the amplitudes in decibels of the two interfering signals above the same arbitrary reference amplitude. Points on the curves may be considered to represent the conditions prerequisite to the reproduction of a desired signal of minimum intelligibility, here chosen to be a six decibel distortion ratio. In interpreting the diagram the larger the ordinate is, the better are the intermodulation characteristics at the corresponding abscissa.

Curve 1 illustrates the normal intermodulation characteristics of a radio receiver having a preliminary amplifier to which no control voltage is employed. Curve 2 illustrates the intermodulation characteristics of the same radio receiver when a control voltage is applied to the preliminary amplifier in the manner illustrated in Fig. 1. In this curve, the preliminary amplifier was not provided with additional feed-through. Curve 3 illustrates the intermodulation characteristics obtained when both the control voltage and feed-through were employed in the preliminary amplifier. Curve 4 illustrates the intermodulation characteristics of a radio receiver in which the filament was deenergized to obtain complete cessation of discharge current in the preliminary amplifier discharge device and in which feed-through was employed. In general, marked improvement in the reception of higher amplitude signals is experienced when the preliminary amplifier discharge device is substantially or completely cut-off and an adequate feed-through for the signals is provided.

In carrying out the invention, the voltage for controlling the operation of amplifier 2 may be obtained from the automatic gain control terminals of a receiver and separately amplified as necessary without disturbing automatic gain control over the other stages of the receiver. This voltage may also be obtained from the intermediate frequency amplifier of a receiver, and separately detected and amplified. Under certain conditions, when two radio frequency amplifier stages are employed, both stages may be controlled, either simultaneously or with a stepped delay so that the second amplifier will be cut-off at a higher signal level. The point at which cut-off should occur depends considerably upon whether the receiver is being used for amplitude modulation or frequency modulation. If used for frequency modulation, the levels are dictated by the type of detection employed and should be adequate to provide complete limiting if a frequency discriminator type detector is employed.

While particular embodiments of the invention have been shown, it will, of course, be understood that the invention is not to be limited thereto since many modifications both in the circuit arrangement and in the instrumentalities employed, may be made, and it is, therefore, contemplated by the appended claims to cover any such modifications as fall within the true spirit and scope of the invention.

What we claim as new and desire to secure by Letters Patent of the United States is:

1. In combination, an amplifier having an amplifying device, an input circuit and an output circuit associated with said amplifying device, said input circuit being tuned to select a band of frequencies, said input circuit including tuning means for tuning said input circuit, means for coupling waves from said tuning means in the input of said amplifying device directly to the output thereof, and means responsive to waves appearing in the output of said amplifier having an amplitude greater than a predetermined amplitude for rendering said amplifying device inoperative, said coupling means coupling the waves appearing at said input directly to said output when said amplifying device is inoperative.

2. In combination, an amplifier having an amplifying device, an input and an output circuit connected thereto, tuning means in said output circuit for tuning said output circuit to select a band of frequencies, means for coupling waves appearing in said input circuit directly to said output circuit in a path utilizing the natural selectivity of said amplifier, said waves being coupled to said tuning means in said output circuit, and means responsive to waves appearing in the output of said amplifier having an amplitude greater than a predetermined amplitude for rendering said amplifying device inoperative, said coupling means coupling the waves appearing at said input directly to said output when said amplifying device is inoperative.

3. In combination, an amplifier having an amplifying device, an input and an output circuit associated with said amplifying devices, each of said input and said output circuits including tuning means for tuning said circuits to select a band of frequencies, capacitive coupling means for passing waves appearing at the tuning means of the input of said amplifying device directly to the tuning means in output thereof, and means responsive to waves appearing in the output of said amplifier and having an amplitude greater than a predetermined amplitude for rendering said amplifying device inoperative, said coupling means coupling the waves appearing at said input directly to said output when said amplifying device is inoperative.

4. In combination, an amplifier including an electron discharge device having a cathode, a grid and an anode, a circuit tuned to select a band of frequencies connected between said grid and cathode, another circuit tuned to select said band of frequencies connected between said cathode and anode, heater means for rendering said cathode operative, impedance means common to said tuned circuits for coupling waves from the input tuned circuit to the output tuned circuit, and means responsive to waves appearing in the output of said amplifier and having an amplitude greater than a predetermined amplitude for rendering said heater means inoperative, thereby rendering said electron discharge device inoperative, said coupling means coupling the waves appearing at said input directly to said output when said electron discharge device is inoperative.

5. In combination, an amplifier including an electron discharge device having a cathode, a grid, a screen grid and an anode, a circuit tuned to select a band of frequencies connected between said grid and cathode, another circuit tuned to select said band of frequencies connected between said cathode and anode, means for coupling waves appearing at the input of said discharge device directly to the output thereof, and means responsive to waves appearing in the output of said amplifier and having an amplitude greater than a predetermined amplitude for biasing said screen grid in a manner to render said electron discharge device inoperative, said coupling means coupling said waves appearing at the input of said discharge device directly to the output of said discharge device when said discharge device is inoperative.

6. A selective amplifier for minimizing the effect on linearity and selectivity of amplification of a desired band of frequencies by undesired large amplitude waves having frequencies adjacent said band of frequencies, comprising a first amplifier stage, a second succeeding stage connected in cascade with said amplifier stage, each of said stages having an electron discharge device, an input and an output circuit connected thereto, said circuits being tuned to select said desired band of frequencies, means for coupling waves appearing at the input circuit of the first of said amplifier stages directly to the output circuit thereof, means responsive to waves appearing in the output circuit of said second succeeding stage and having an amplitude greater than a predetermined amplitude for rendering the electron discharge device of said first stage inoperative, whereby waves having said undesired frequencies are selectively reduced in amplitude by said tuned circuits before reaching the input of said succeeding stage, said coupling means coupling waves appearing at the input circuit of said first of said amplifier stage directly to the circuit output thereof when said electron discharge device of said first stage is inoperative.

7. In combination, an amplifier having an electron discharge device including a cathode heater for producing electronic emission in said discharge device, an input and an output circuit connected to said discharge device, at least one of said circuits being tuned to select a band of frequencies, means for coupling waves appearing at the input of said electron discharge device directly to the output thereof, a source of energizing potentials for said cathode heater, and switching means in circuit with said heater and said source responsive to waves appearing in the output of said amplifier having an amplitude greater than a predetermined value for disconnecting said cathode heater from said source, thereby rendering said electron discharge device inoperative, said coupling means coupling said waves appearing at the input of said electron discharge device directly to the output thereof when said electron discharge device is inoperative.

8. In combination in a radio receiver, an amplifying stage, a plurality of stages succeeding and connected in cascade with said amplifying stage, said amplifying stage comprising an amplifying device, input and output circuits for said amplifying device, at least one of said circuits being tuned to select a band of frequencies, means for coupling waves appearing at the input circuit of said amplifying stage directly to the output thereof in shunt of said amplifying device, means responsive to waves appearing in the input of a succeeding one of said stages and having an amplitude greater than a predetermined amplitude for maintaining said amplifying device inoperative, said coupling means coupling said waves appearing at the input of said amplifying device directly to the output of said amplifying device when said amplifying device is inoperative.

References Cited in the file of this patent

UNITED STATES PATENTS

| | | |
|---|---|---|
| 1,991,372 | Bowles | Feb. 19, 1935 |
| 2,024,489 | Van der Pol | Dec. 17, 1935 |
| 2,237,407 | Brück | Apr. 8, 1941 |
| 2,318,061 | Dailey | May 4, 1943 |
| 2,396,390 | Smith et al. | Mar. 12, 1946 |
| 2,457,214 | Doll et al. | Dec. 28, 1948 |
| 2,504,699 | Kluender | Apr. 18, 1950 |
| 2,589,299 | Setchell | Mar. 18, 1952 |
| 2,646,469 | Long | July 21, 1953 |